United States Patent [19]

Gray et al.

[11] 4,050,031
[45] Sept. 20, 1977

[54] CIRCUIT AND STRUCTURE HAVING HIGH INPUT IMPEDANCE AND DC RETURN

[75] Inventors: Paul R. Gray, Orinda; Mark L. Stephens, Campbell, both of Calif.

[73] Assignee: Signetics Corporation, Sunnyvale, Calif.

[21] Appl. No.: 662,462

[22] Filed: Mar. 1, 1976

[51] Int. Cl.² .......................... H03F 3/10; H03F 3/16
[52] U.S. Cl. ........................................ 330/24; 330/35; 330/40
[58] Field of Search ................... 330/22, 24, 35, 40; 307/304

[56] References Cited

U.S. PATENT DOCUMENTS

| | | | |
|---|---|---|---|
| 3,448,397 | 6/1969 | Lin et al. | 330/40 X |
| 3,879,640 | 4/1975 | Schade | 307/304 X |

*Primary Examiner*—James B. Mullins
*Attorney, Agent, or Firm*—C. Richard Pfeiffer; William H. Dana

[57] ABSTRACT

An amplifier circuit and structure having high input impedance and having a return path for conducting amplifier DC leakage current. A common diode structure forms the return path and includes two diodes connected in series and connected in opposite conduction directions. The diode having a forward conduction direction which is in the opposite direction of the leakage current is provided with a reverse saturation current which is substantially greater than the leakage current of the amplifier. The amplifier is typically a P channel or N channel field effect transistor (FET) and the double diode structure is typically an NPN or PNP transistor.

13 Claims, 15 Drawing Figures

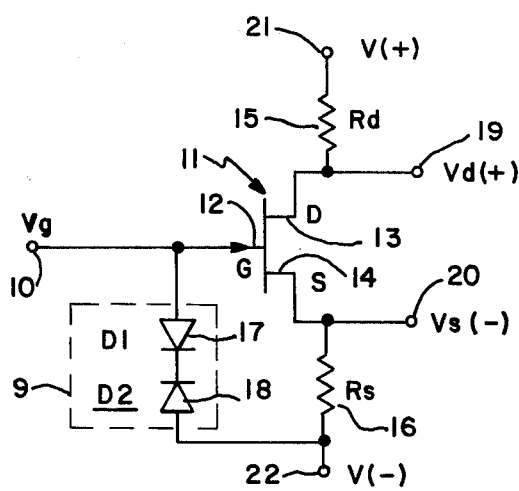
FIG.—1
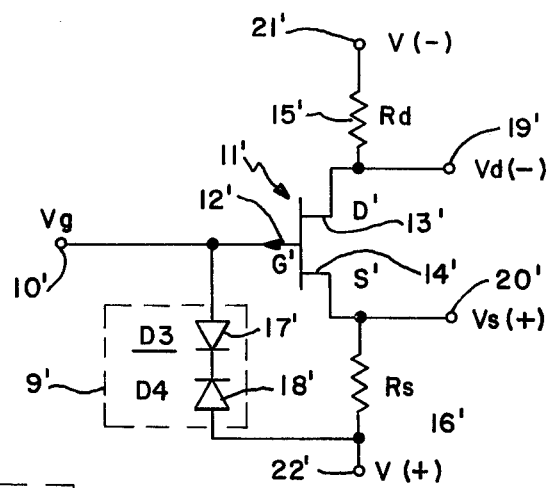
FIG.—2
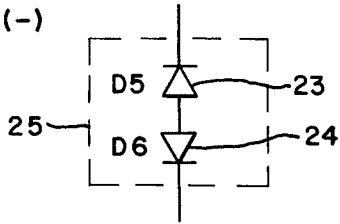
FIG.—3
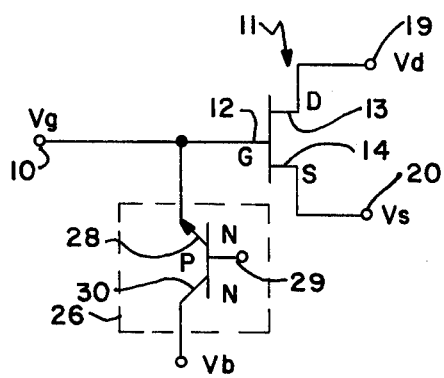
FIG.—4
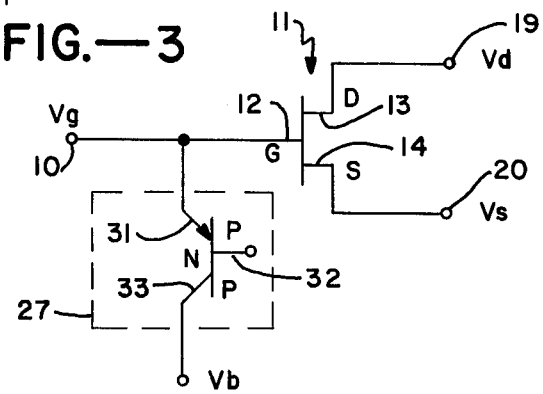
FIG.—5
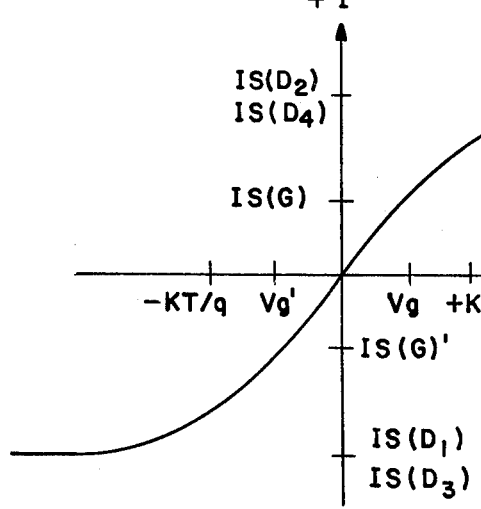
FIG.—6
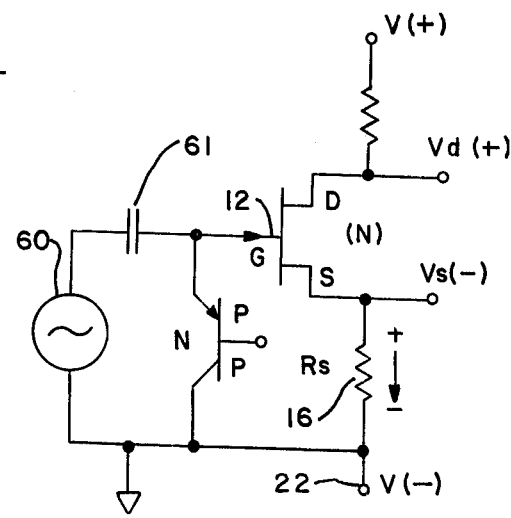
FIG.—15

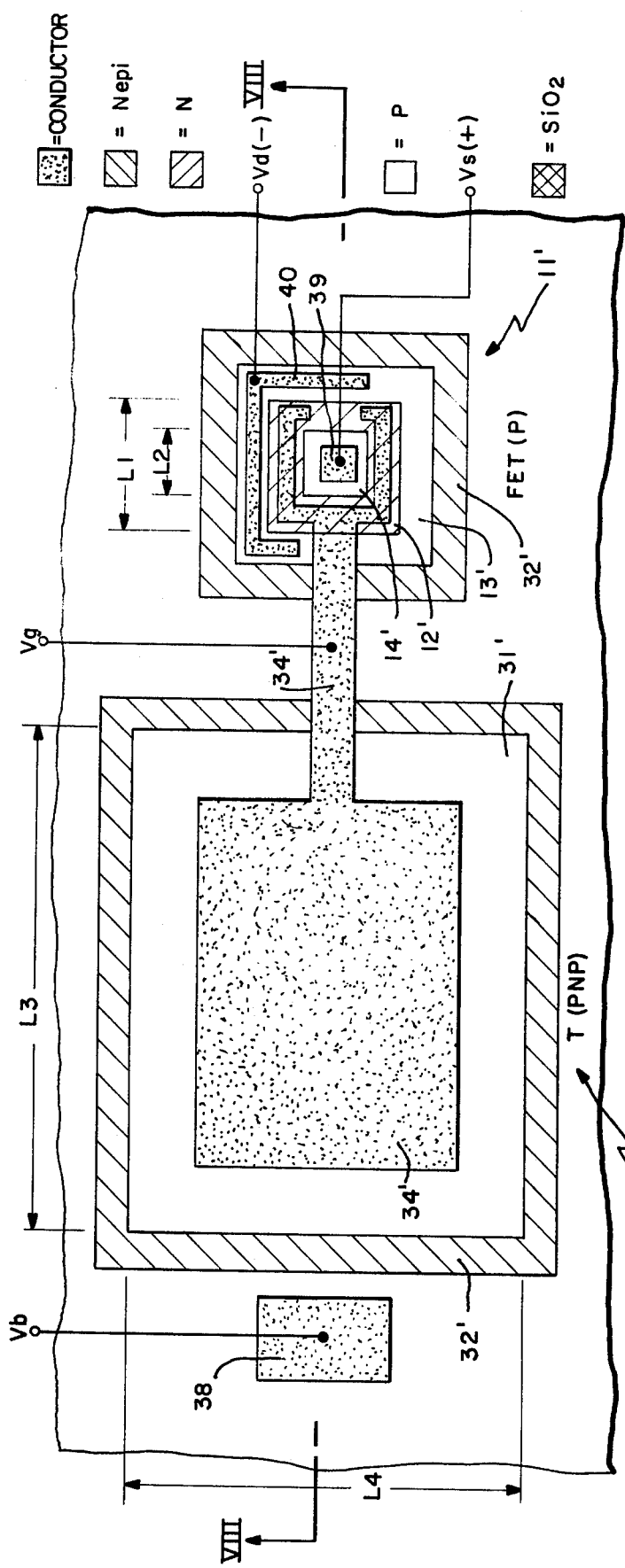
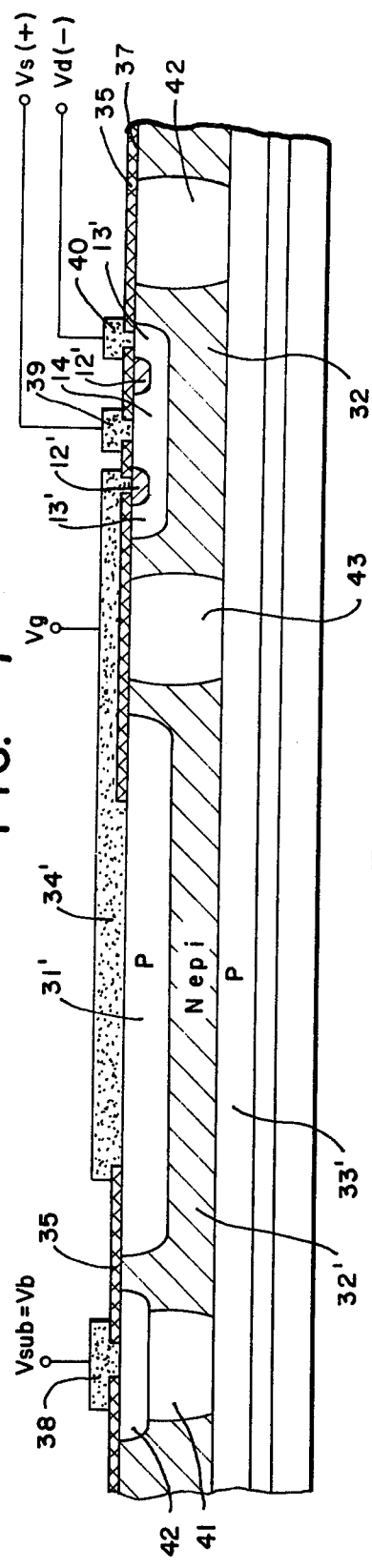
FIG.—7
FIG.—8

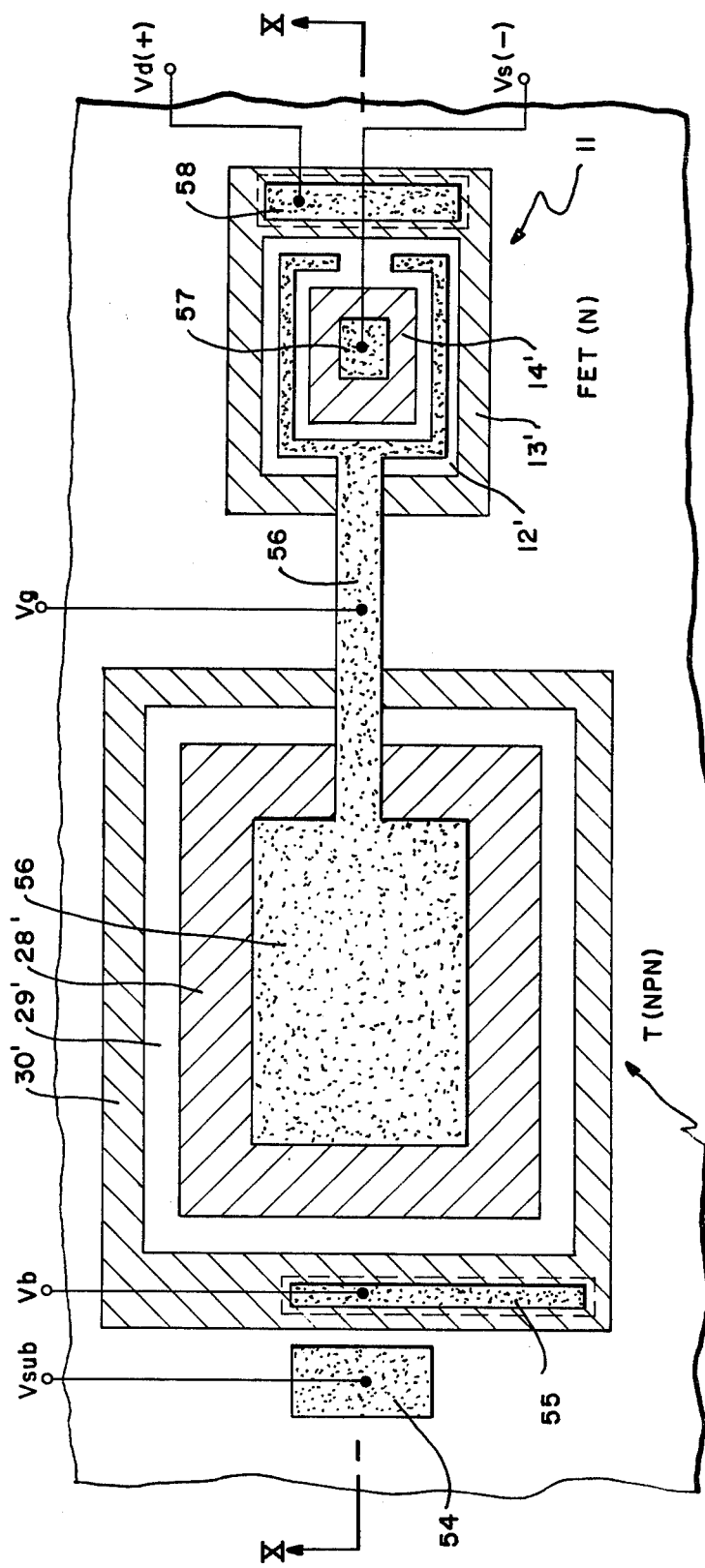
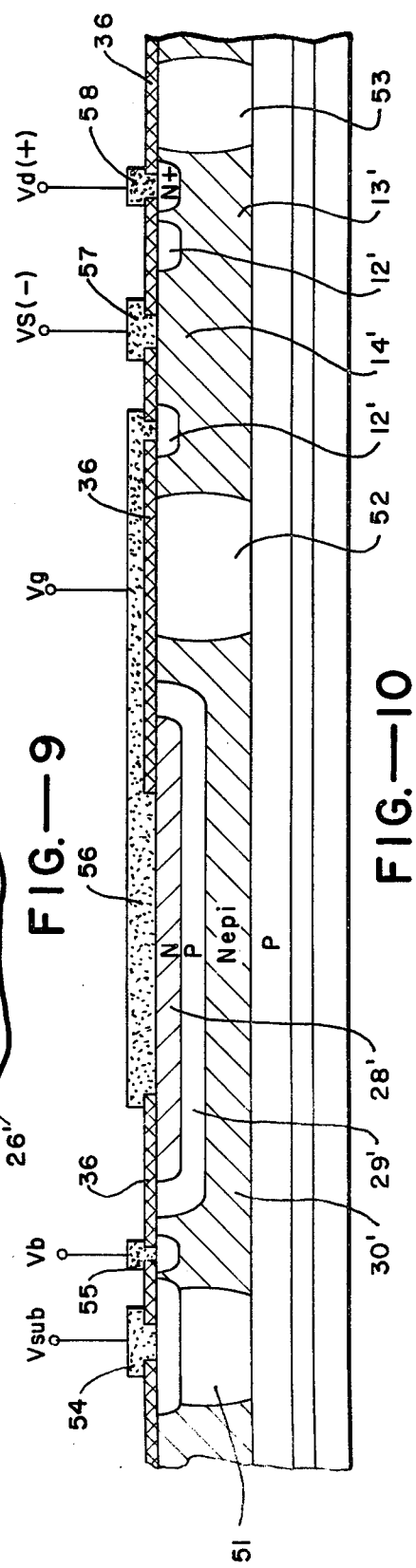
FIG.—9
FIG.—10

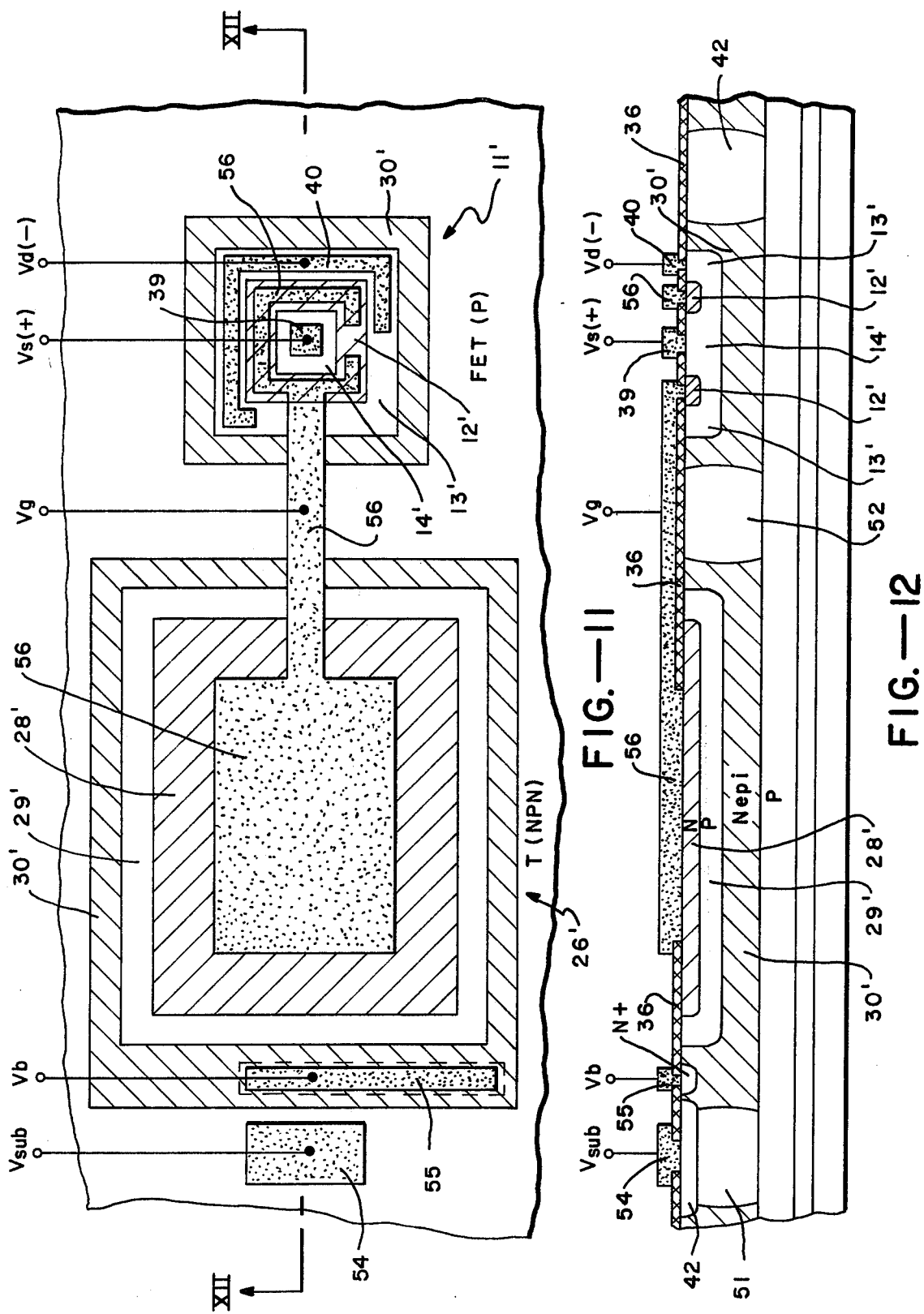
FIG.—11
FIG.—12

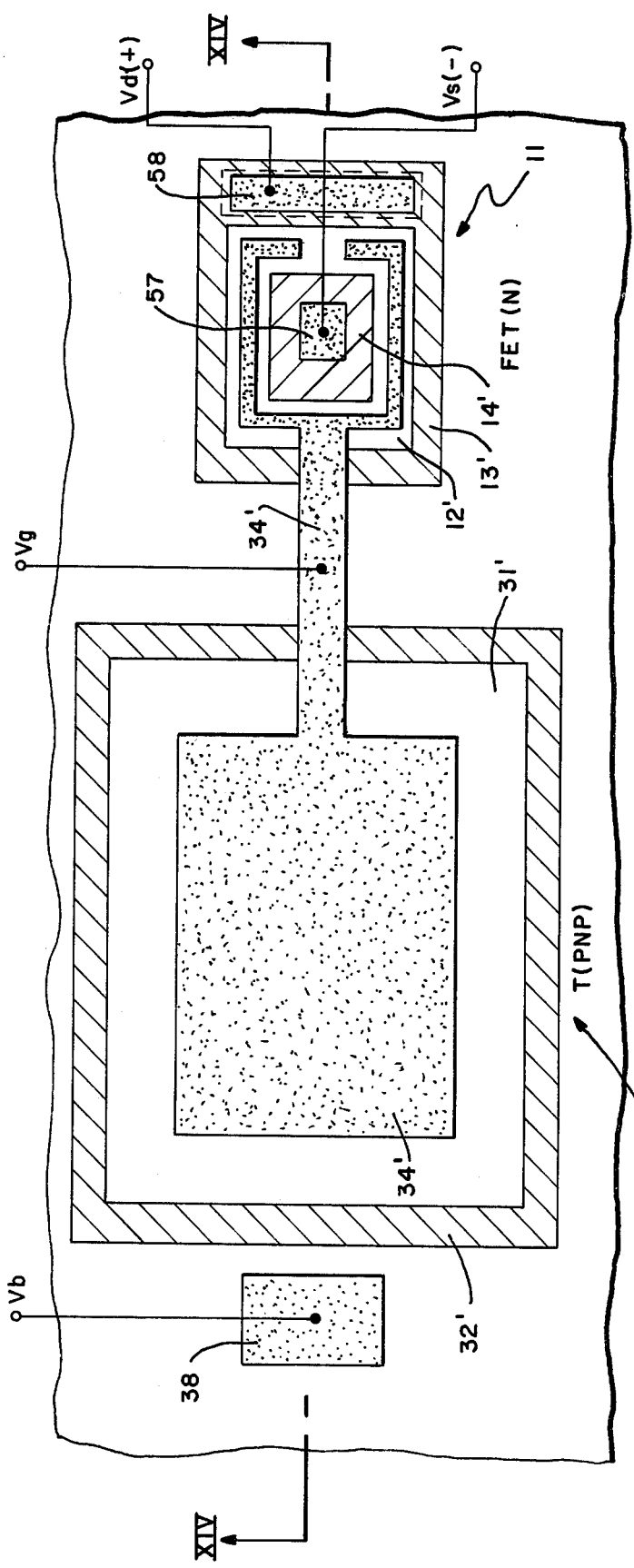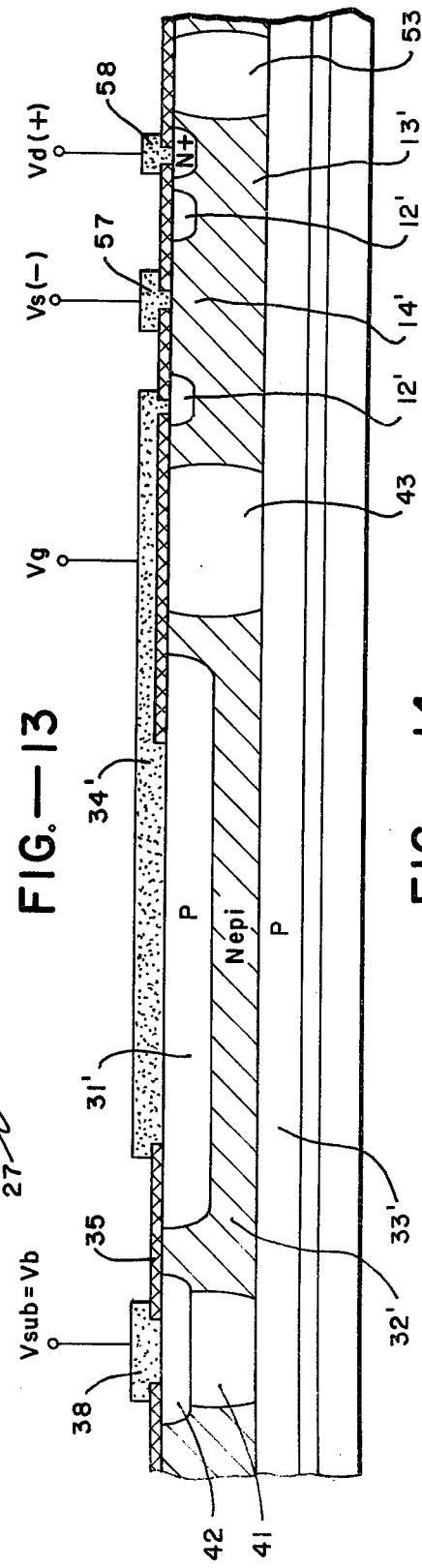
FIG.—13
FIG.—14

CIRCUIT AND STRUCTURE HAVING HIGH INPUT IMPEDANCE AND DC RETURN

BACKGROUND OF THE INVENTION

The present invention relates to high impedance amplifiers having leakage current and a DC return for the leakage current. Specifically, the invention relates to amplifiers, such as field effect transistors (FET's), utilized in connection with a capacitive input signal source.

When high input impedance amplifiers are connected to capacitive input signal sources, a problem arises in the form of a DC-caused capacitive charge. The capacitive charge, if not prevented, interferes with the AC operation. In order to prevent the charge accumulation, a DC sink (return path) must be provided while still maintaining a high input impedance for AC signals. Also, it is desirable to maintain the input potential level, in the absence of an input signal, at a precisely defined value which is typically a value near zero (such as a few millivolts).

The problem typically arises when a capacitive bridge or other capacitive circuit is connected to provide an AC input signal to the gate of a field effect transistor (FET). The FET is connected as an amplifier with the gate reverse biased. The reverse bias on the gate causes a small leakage current which is present even in the absence of an input AC signal at the gate. Unless a DC return path is provided, the leakage current causes a charge to build up on the capacitive input. This charge adversely affects propagation of the AC signal.

One solution to charge build up problem is to connect a high-value resistor from the FET gate to ground or other sink potential. Such a resistor typically has a value of 1,000 megohms. These resistors are not satisfactory, however, since they are expensive, bulky and not readily incorporated in integrated circuit structures.

In view of the above background, there is a need for an improved amplifier structure having a leakage current return path, having a precise no-signal gate voltage, having a high AC input impedance and which is compatible with integrated circuit processing techniques.

SUMMARY OF INVENTION

The present invention is a high input impedance amplifier having a DC return for leakage current. The leakage current return path includes a series connected common diode structure in which two diodes are connected with their forward conduction states in opposite directions.

In an embodiment where the input amplifier is a field effect transistor (FET), the FET gate forms a semiconductor junction (PN or NP) with the FET source/drain. The junction is is reverse biased and the FET operates as an amplifier. The reverse bias on the FET junction causes a leakage current through the FET gate. A return path is provided from the FET gate by a common diode structure where first and second diodes have their forward conduction states connected in opposite directions. For input AC signals, one or the other of the diodes is reverse biased and therefore the common diode structure provides a very high AC input impedance.

The one of the two diodes which has the same forward conduction state as the FET gate junction is selected to have a reverse bias saturation current much greater than the reverse saturation current of the FET gate. This relationship insures that the no-signal potential on the FET gate does not exceed approximately $\pm KT/q$ volts where K is Boltzmann's constant, T is absolute temperature and $q$ is the charge of an electron.

The common diode structure is constructed with the diodes connected in either a common cathode configuration or in a common anode configuration. Also, either P channel or N channel FET's are employed in the invention.

In one preferred embodiment, both the common diode structure and the FET structure are formed in one integrated semiconductor structure. In such an embodiment, the common diode structure typically is formed by either an NPN or a PNP transistor structure. In a common diode transistor structure, the emitter/base junction of the transistor forms one diode. For an NPN transistor and for an N channel FET, the emitter/base junction is made larger in area than the gate/source-drain junction (gate junction) of the FET. The emitter/base junction is made larger than the FET gate junction to insure that the reverse saturation current of the gate is less than the reverse saturation current of the emitter/base.

For an NPN transistor and a P channel FET, the base/collector junction is larger than the FET gate junction in order to obtain the desired relationship between saturation currents.

For a PNP transistor and an N channel FET, the base/collector junction is made larger than the FET gate junction to obtain the desired relationship between reverse saturation currents.

For a PNP transistor and a P channel FET, the emitter/base junction is made larger than the FET gate junction to obtain the desired relationship between the reverse saturation currents.

In accordance with one embodiment of the invention, a common diode structure and an FET structure are manufactured with a common P substrate which carries an N epitaxial layer. A common diode structure in the form of a PNP transistor is conveniently made by forming a first P region in the N epitaxial layer. A P channel FET is also conveniently made by forming a second P region in the N epitaxial layer at a location isolated from the PNP transistor structure. The second P region forms the source and drain of the FET. The gate of the FET is formed by diffusing a hollow N region into the second P region. Appropriate silicon dioxide insulators cover the various regions and allow interconnection of the emitter of the PNP structure with the gate of the FET structure. No connection is made to the base region (the N epitaxial layer) of the PNP transistor so that the base potential is allowed to float. The PNP transistor structure described causes the gate of the FET to be at substantially the same potential as the potential of the substrate.

In another embodiment of the invention, a P substrate and an N epitaxial layer are employed. An NPN transistor structure is constructed by forming a first P region in the N epitaxial region and thereafter forming another N region in the P region.

In order to form an N channel FET, a hollow P region is formed in the N epitaxial layer.

In all of the above semiconductor structures, the area of the reverse biased diode junction of the transistor is made much larger than the area of the reverse biased FET gate. In a typical example, the transistor junction is made 15 times greater than the FET gate junction.

In accordance with the above summary the present invention achieves the objective of providing an amplifier circuit and structure which has a DC leakage current return path, which provides high input AC impedance, which is compatible with integrated circuit processing techniques, and which holds the no-signal FET gate potential within predetermined limits.

The foregoing and other objects, features and advantages of the invention will be apparent from the following more particular description of preferred embodiments of the invention as illustrated in the accompanying drawings.

BRIEF DESCRIPTION OF THE DRAWINGS

FIG. 1 depicts an electrical schematic representation of an N channel field effect transistor (FET) amplifier having a leakage current return path formed by a common diode structure connected in a common cathode configuration.

FIG. 2 depicts an electrical schematic representation of a P channel FET amplifier having a leakage current return path formed by a common diode structure connected in a common cathode configuration.

FIG. 3 depicts a schematic representation of a common diode structure formed by a common anode connection of two diodes where the common diode structure is suitable for substitution return in the FIG. 1 and FIG. 2 circuits.

FIG. 4 depicts an electrical schematic representation of an FET amplifier having a leakage current return path through a common diode structure formed by an NPN transistor.

FIG. 5 depicts an electrical schematic representation of an FET amplifier having a leakage current return path through a common diode structure formed by a PNP transistor.

FIG. 6 depicts a graph representing the voltage and current relationship through the common diode structure.

FIG. 7 depicts a top view of a semiconductor structure including a P channel FET interconnected with a common diode PNP transistor.

FIG. 8 depicts a cross-sectional front view taken along a center line of the FIG. 7 structure.

FIG. 9 depicts a top view of a semiconductor structure including an N channel FET interconnected with a common diode NPN transistor.

FIG. 10 depicts a cross-sectional front view taken along a center line of the FIG. 9 structure.

FIG. 11 depicts a top view of a semiconductor structure including a P channel FET and a common diode NPN transistor.

FIG. 12 depicts a cross-sectional front view taken along a center line of the FIG. 11 structure.

FIG. 13 depicts a top view of a semiconductor structure including an N channel FET interconnected with a common diode PNP transistor.

FIG. 14 depicts a cross-sectional from view taken along a center line of the FIG. 13 structure.

FIG. 15 depicts an electrical schematic diagram of an N channel FET having a PNP transistor leakage current return and including a signal source applying a signal through a capacitor.

DETAILED DESCRIPTION

N Channel FET And Common Cathode Diode Structure — FIG. 1

IN FIG. 1, a field effect transistor (FET) 11 has a gate(G) 12, a drain(D) 13 and a source(S) 14. The gate 12 is connected to receive an input signal, Vg, on an input terminal 10. The drain output, Vd(+), appears on an output terminal 19. The source output, Vs(−), appears on an output terminal 20. The drain 13 is connected through a drain resistor, Rd, 15 to a terminal 21 which is at a positive voltage V(+). The source 14 is connected through a source resistor, Rs, 16 to a terminal 22 which supplies a negative voltage V(−). The positive and negative signs associated with the voltages signify the relative relationship between the source and drain potentials.

In the example of FIG. 1, the FET 11 is of the N channel type. Therefore, the source and drain regions are N material while the gate region 12 is P material. The forward conduction direction of the FET 11 is in the direction of the arrow shown at the gate 12. In order to operate as a conventional amplifier, FET 11 is reverse biased which means that the potential of the source 14 is more positive than the potential of the gate 12. Such a reverse biasing causes the PN junction formed between the gate 12 and the source 14 and drain 13 to have a leakage current which is in the opposite direction of the arrow shown at gate 12.

The maximum value of the leakage current is the reverse saturation current, Is(G), of the gate. In order that the gate leakage current not interfere with the operation of external circuits connected at terminal 10 (not shown) a leakage current return path is provided between the gate 12 and terminal 22. In FIG. 1, the leakage current return path includes the common diode structure 9 which consists of the D1 diode 17 and the D2 diode 18. Because FET 11 is an N channel device, the diode D2 has a forward conduction direction which is the same as the forward conduction direction of the gate diode for FET 11. The gate diode for FET 11 is formed by the junction between the P gate material and the N source-drain material.

In accordance with the present invention, the reverse saturation current of the D2 diode 18 is made greater than the reverse saturation current of the FET gate. All of the leakage current through the gate 12 is readily conducted through the D1 diode 17 in the forward conduction direction and through the D2 diode 18 in the reverse conduction direction. Because of the conduction of leakage current through the common diode structure 9, there is substantially no leakage current available through terminal 10 to interfere with any connected external circuit(not shown).

In addition to providing a return path for leakage current, the common diode structure 9 presents a high input impedance of the order of $10^{10}$ ohms for AC input signals.

VOLTAGE/CURRENT GRAPH — FIG. 6

Referring to FIG. 6, the voltage/current graph of the common diode structure 9 of FIG. 1 is shown. For positive voltages applied between terminal 10 and terminal 22, the D1 diode 17 is forward conducting and does not provide a limiting contribution to the FIG. 6 waveform. The D2 diode 18, however, is reverse biased and conducts a reverse current in the direction of +I in FIG. 6. The reverse current increases rapidly from 0 volts up to a voltage of approximately $KT/q$ where K is the well known Boltzmann constant, T is the absolute temperature and $q$ is the electronic charge. For room temperature, the value of $+KT/q$ is approximately 26 millivolts. After $+KT/q$, increases in voltage, $+V$, do not cause an appreciable increase in current since the saturation current, Is(D2), of the D2 diode 18 is reached.

In FIG. 6, for negative voltages, $-V$, applied between the terminals 10 and 22, the D2 diode 18 is forward conducting and hence does not provide a limitation on the current through the common diode structure 9. Under these conditions, however, the D1 diode 17 is reverse biased and has a maximum current known as the reverse saturation current, Is(D1).

Since the FET 11 has an PN junction between the gate and the source-drain, the reverse biased leakage current of the FET has a current/voltage distribution similar to the right hand portion of the FIG. 6 graph. However, in accordance with the present invention, the leakage current, Is(G), is much smaller than the diode reverse saturation current Is(D2). For this reason, the gate voltage, Vg(0), when no input signal is applied on terminal 10, is determined by the value of Is(G). As can be seen from FIG. 6, Vg(0) is less than $+KT/q$.

P CHANNEL FET AND COMMON CATHODE DIODE STRUCTURE — FIG. 2

In FIG. 2, a P channel FET 11' is shown connected in an identical manner to the N channel FET 11 in FIG. 1. In FIG. 2, corresponding elements are identified with corresponding primed numbers.

In FIG. 2, the gate(G) 12' of FET 11' has a forward direction opposite to that of the forward direction of the FIG. 1 FET. For this reason, the D3 diode 17' is selected to have a reverse saturation current Is(D3) which is substantially greater than the gate leakage current, Is(G') of the FET 11'. Accordingly, when no input signal is applied at terminal 10', the voltage, Vg(0), on the gate 12' is less than $-KT/q$ as can be seen by referring to FIG. 6.

It is evident from a comparison of FIGS. 1, 2 and FIG. 6 that the common diode structures 9 and 9' each provide a leakage current return path which insures for both N channel and P channel FET's that, with no input signal, the FET gate bias will be within $KT/q$ volts of a preselected reference. Furthermore, the common diode structure 9 and 9' provide high impedance for AC input signals.

COMMON ANODE DIODE STRUCTURE — FIG. 3

In FIG. 3, the D5 diode 23 and the D6 diode 24 are connected in a common anode structure 25. The structure 25 can be substituted for structure 9 or 9' in FIGS. 1 and 2 respectively. When the common anode structure 25 is substituted for the structure 9 in FIG. 1, the D5 diode 23 is selected, like the diode D2, to have a reverse saturation current greater than the leakage current of FET 11. Similarly, when the diode structure 25 of FIG. 3 is selected to replace the diode structure 9' in FIG. 2, the D6 diode 24, like the D3 diode 17', is selected to have a reverse saturation current greater than the leakage current of the FET 11'.

NPN COMMON DIODE RETURN PATH — FIG. 4

In FIG. 4, the leakage current return path between gate 12 and Vb is provided by a common diode structure 26. Common diode structure 26 is an NPN transistor having an emitter 28, a base 29 and a collector 30. The emitter/base NP junction of structure 26 in FIG. 4 performs the function of the D5 diode in FIG. 3. Similarly, the base/collector PN junction of structure 26 in FIG. 4 performs the function of the D6 diode 24 in FIG. 3. The base 29 of the structure 26 is floating in that it is not connected to any other point in the circuit. Therefore, the structure 26 does not have carrier injection through the base. Without a base connection, the NPN transistor structure 26 is the equivalent of the common diode structure 25 of FIG. 3.

The FET 11 disclosed in FIG. 4 is like the N channel FET 11 of FIG. 1. It can also be like the P channel FET 11' of FIG. 2. The NPN transistor structure 26 in FIG. 4 therefore may be utilized with either an N channel or a P channel FET. When structure 26 is utilized with an N channel FET, then the emitter/base NP junction is the one which is selected to have a reverse saturtion current greater than the leakage current of the FET. When the NPN transistor structure is utilized with a P channel FET, then the base/collector PN junction is the one selected to have a reverse saturation current greater than the leakage current of the FET.

PNP COMMON DIODE RETURN PATH — FIG. 5

In FIG. 5, an FET 11 is shown having a PNP transistor forming a common diode structure 27 as a leakage current return path. The transistor 27 includes an emitter 31, a base 32 and a collector 33. The base 32 is floating and not connected to any other point in the circuit. The structure 27 is equivalent to the common cathode diode structure 9 in FIG. 1 or the structure 9' in FIG. 2. The FET 11 disclosed in FIG. 5 can be either an N channel or a P channel. When the PNP structure 27 is connected to an N channel FET, such as structure 11 in FIG. 1, then the base/collector NP junction is selected with a reverse saturation current exceeding the leakage current of the FET. When the PNP structure 27 is connected to a P channel FET, such as structure 11' in FIG. 2, emitter/base PN junction is selected with a reverse saturation current exceeding the leakage current of the FET.

The graph of FIG. 6 is applicable to both the transistor structures 26 and 27 if the emitter/base and the base/collector junctions are employed as the appropriate diodes.

PNP COMMON DIODE AND P CHANNEL FET INTEGRATED STRUCTURE — FIGS. 7&8

In FIG. 7, a top view of an integrated semiconductor structure is shown including a PNP common diode structure 27 and a P channel FET 11'. The PNP common diode structure includes an N region 32' which forms the base of the PNP structure. A P region 31' is formed within the region 32' and is the emitter of the structure 27. The area of the junction between the N base region 32' and the P emitter region 31' is made equal to approximately 180 square units. This area is achieved, for example, by making the perimeter of the P region 31' a rectangle having a length L3 of fifteen units and a width L4 of twelve units.

Referring to FIG. 8, a cross-section of the FIG. 7 structure is shown along the center line VIII — VIII of FIG. 7. In FIG. 8, the N region 32', which forms the base of the common diode structure 27, is supported on a P region substrate 33'. The P region substrate 33' forms the collector of the common diode structure 27.

Referring to FIG. 7, the P channel FET 11' includes a P drain region 13', an N gate region 12' and a P source region 14'. The junction between the gate region 12' and the source-drain regions 13'-14' is made equal to an area of approximately twelve square units. The area of twelve square units is selected for the gate junction FET 11' so that it will be 1/15th the size (180 square units) of the emitter/base junction of the common diode structure 27. The gate 12' has a junction are of approximately twelve square units in FIG. 7 by making the outer perimeter a square having a dimension L1, on each side, equal to four units. Therefore the outer perimeter of the gate region 12' defines an area of sixteen square units. The P source region 14' is contained within the gate region 12'. The source region 14' has a perimeter in the form of a square having a dimension L2 on a side. The dimension L2 is equal to two units so that the source region 14' defines an area of four square units. The four square units of the source region 14' are subtracted from the sixteen square units so that the gate region 12' has a total area of approximately twelve square units.

The twelve square units of the gray region 12' is 1/15th the size of the emitter/base junction of the common diode structure 27. Accordingly, the reverse saturation current of the emitter/base junction of the common diode structure 27 will be much greater than the reverse saturation current of the base region of the FET 11'. Therefore, the integrated semiconductor structure of FIGS. 7 and 8 insures that the desired current and voltage relationships, as previously discussed in connection with FIG. 6, will be obtained.

In FIGS. 7 and 8, a metalization conductor 34' connect the P region 31' to the N gate region 12'. A silicon dioxide layer 35 (not shown in FIG. 7) appears along the upper surface plane 37 of the N epitaxial layer 32'. The silicon dioxide layer 35 has openings above various regions in the structure including an opening with a contact 38 above the P isolation regions 41 and 42. The silicon dioxide layer 35 also has an opening above both the P region 31' and the N region 12'. Silicon dioxide layer 35 has another opening below the source contact 39. An opening also occurs above the drain region 13' to allow contact with the conductor 40, which is connected to the Vd(−) terminal. The isolation region 43 provides isolation between the PNP diode structure 27 and the FET 11'. The isolation regions 41 and 42 are generally employed to separate the combined structure 27 and 11' from any other structures that may rest on the same substrate. The regions 41 and 42 are not explicitly shown in FIG. 8; but may entirely encircle the structure of FIG. 7.

It is apparent from FIG. 8 that the function of PNP common diode structure 27 is to connect the substrate 33' to the gate 12' of the FET 11'. Therefore, during operation of the structure depicted by FIGS. 7 and 8 in an electrical circuit, the gate potential Vg will be required to be at substantially the substrate potential Vb.

NPN COMMON DIODE AND N CHANNEL FET INTEGRATED STRUCTURE — FIGS. 9&10

In FIG. 9, an NPN common diode structure 26' is shown interconnected to an N channel FET 11. The common diode structure 26' includes an N epitaxial region 30' which forms the collector of the structure 26'. A P base region 29' then is formed within the N region 30'. An N region 28' then is carried within the P region 29'. It is the N region 28' which forms the emitter of the NPN structure 26'.

In FIG. 9, the N channel FET 11 includes an N drain region 13', a P gate region 12' and an N source region 14'. A conductor 56 connects the N emitter region 28' of the NPN common diode structure 26' to the P gate region 12' of the FET 11.

In FIG. 9, the dimensions of the N region emitter 28' are 12 by 15 units and thereby define an area of 180 square units, which is the approximate junction between the emitter region 28' and the base region 29'. Also in FIG. 9, the area of the junction between the gate 12' and the source-drain region 13' - 14' is approximately 12 square units. Therefore, the emitter/base junction of the common diode structure is 15 times greater than the area of the gate junction in the FET 11. Therefore, the relationship between the reverse saturation currents of the emitter/base diode in the common diode structure relative to the reverse saturation current of the FET gate is as defined in FIG. 6. Namely, the emitter/base diode is reverse biased and functions to hold the gate potential Vg(0) to a potential level less than +KT/q of applied voltage Vd when no input signal is being applied.

In FIG. 10, a silicon dioxide layer 36 appears along the upper surface plane of the N epitaxial region 30'. The silicon dioxide layer 36 has openings above various regions in the structure including both an opening with a contact 54 above the P isolation region 51 and an opening below a contact 55. The silicon dioxide layer also has an opening above both the N region 28' and the P gate region 12'. There is another opening in the silicon dioxide layer above the N source region 14' below the source contact 57, which is connected to the Vs(−) terminal. An opening also occurs above the N drain region 13' to allow contact with the conductor 58, which is connected to the Vd(+) terminal.

As was the similar instance in FIGS. 7 and 8, isolation regions 51 and 53 separate the combined structure 26' and 11 from any other structures that may rest on the same substrate.

NPN COMMON DIODE AND P CHANNEL FET INTEGRATED STRUCTURE — FIGS. 11&12

In FIGS. 11 and 12, and NPN common diode structure 26' identical to the one described in FIGS. 9 and 10 is shown interconnected to a P channel FET 11' functionally identical to the one described in FIGS. 7 and 8.

The NPN common diode structure 26' includes an N epitaxial region 30' which forms the collector. A P base region 29' then is formed within the N epitaxial region 30'. An N region 28' forms the emitter of the NPN structure and is carried within the P base region 29'. The area of the junction between the P base 29' and the N collector 30' is made equal to approximately 180 square units.

The P channel FET 11' includes a P drain region 13', an N gate region 12' and a P source region 14'. As in FIGS. 7 and 8, the junction between the gate region 12' and the source-drain regions 13'-14' is made equal to approximately twelve square units. Therefore, the area of the base/collector junction of the common diode structure is 15 times greater than the area of the FET gate junction. This insures that the desired relationships depicted in FIG. 6 will be obtained.

In FIGS. 11 and 12, a conductor 56 connects the N emitter region 28' of the NPN common diode structure to the N gate region 12' of the FET. In FIG. 12, a silicon dioxide layer 36 (not shown in FIG. 11) appears along the upper surface plane 37 of the N epitaxial region 30'. The silicon dioxide layer 36 has openings above several regions in the structure including both an opening with a contact 54 above the P isolation regions 51 and 42 and an opening below a contact 55. There are also openings in the silicon dioxide layer 36 above both the N emitter region 28' of the NPN common diode structure and the two N gate regions 12' of the FET 11'. Other openings exist below the source contact 39, which is connected to the Vs(+) terminal, and above the drain region 13' to allow contact with the conductor 40, which is connected to the Vd(−) terminal.

PNP COMMON DIODE AND N CHANNEL FET INTEGRATED STRUCTURE - FIGS. 13&14

In FIGS. 13 and 14, a PNP common diode structure 27 identical to the one described in FIGS. 7 and 8 is shown interconnected to an N channel FET identical to the one described in FIGS. 9 and 10.

The PNP common diode structure includes an N region 32' which forms the base of the PNP structure 27. A P region 31', which functions as the emitter of structure 27, is formed within the region 32'. The N epitaxial region 32' rests upon a P substrate region 33', which is the collector of structure 27. The area of the junction between the N base region 32' and the P collector region 33' is made equal to approximately 180 square units. This area for the base/collector junction is achieved, for example, by making the outside perimeter of the N region 32' in FIG. 13 be a rectangle having a length of 15 units and a width of 12 units.

In FIG. 13, the N channel FET 11 includes an N drain region 13', a P gate region 12', and an N source region 14'. The area of the junction between the gate 12' and the source-drain region 13'-14' is made equal to an area of approximately 12 square units. The area of the base/collector junction of the PNP common diode structure 27 therefore is 15 times greater than the area of the FET gate junction. This means the relationship between the reverse saturation currents of the base/collector diode in the common diode structure and the reverse saturation current of the FET gate is as defined in FIG. 6.

In FIG. 14, which is a cross-sectional view of the FIG. 13 structure taken along the center line XIV — XIV of FIG. 13, a silicon dioxide layer 35 appears along the upper surface plane of the N epitaxial layer 32'.

The silicon dioxide layer 35, which can be seen in FIG. 14 only, has several openings above the various regions in the structure. It has an opening above the P isolation regions 41 and 42 and below contact 38, which is connected to the Vb terminal. There are also openings below those two sections of conductor 34' which are above the P region 31' and the P gate region 12'. Another opening exists above the N source region 14' below the source contact 57, which is connected to the Vs(−) terminal. In addition, an opening also occurs above the N drain region 13' to allow contact with conductor 58, which is connected to the Vd(+) terminal.

In FIGS. 13 and 14, a conductor 34' connects the P region 31' of the PNP common diode structure 27' to the P gate region 12' of the FET 11. Contact 34' is also connected to terminal Vg.

Isolation regions 41, 42 and 53 separate the combined structure 27 and 11 from any other structures that may rest on the same P substrate region 33'. The isolation regions are not explicitly shown in FIG. 14; but may encircle entirely the structure of FIG. 13.

STRUCTURE WITH SIGNAL APPLIED THROUGH CAPACITOR — FIG. 15

FIG. 15 is an electrical schematic diagram of the structure depicted in FIGS. 13 and 14. It illustrates that the input signal to gate 12 may be produced by a conventional signal source 60 connected to a capacitor 61.

The signal generator 60 typically transmits an AC signal. The input signal is conducted through a capacitive bridge or circuit to provide a high AC input impedance to gate 12 of the FET. The FET, which in FIG. 15 is an N channel, can be either a P channel or an N channel. As noted earlier, the FET is connected as an amplifier with the gate reverse biased. This would cause a small and undesirable reverse leakage current to be present and to possibly build up a charge on the capacitive input unless a DC return path is provided.

We claim:

1. A high impedance amplifier circuit comprising, an amplifier for receiving an input signal, said amplifier exhibiting a leakage current conducting in one direction, a leakage current conduction path connected to said amplifier for continuously biasing said amplifier and continuously providing a return for said leakage current irrespective of said input signal polarity and magnitude, said conduction path including first and second diode structures connected in series in opposite conduction directions said structure being operative independent of external fields and biasing means, one of said diode structure having a forward conduction direction opposite to said one direction and exhibiting a reverse saturation current greater than the magnitude of said leakage current.

2. The circuit of claim 1 wherein said first and second diode structures form an NPN transistor structure.

3. The circuit of claim 1 wherein said first and second diode structures form a PNP transistor structure.

4. The circuit of claim 1 wherein said amplifier is a field effect transistor.

5. The circuit of claim 4 wherein said transistor includes an N channel.

6. The circuit of claim 5 wherein the first and second diode structures form an NPN transistor structure.

7. The circuit of claim 5 wherein the first and second diode structures form a PNP transistor structure.

8. The circuit of claim 4 wherein said transistor includes a P channel.

9. The circuit of claim 8 wherein the first and second diode structures form an NPN transistor structure.

10. The circuit of claim 8 wherein the first and second diode structures form a PNP transistor structure.

11. The circuit of claim 1 wherein said first and second diode structures are connected in a common cathode configuration.

12. The circuit of claim 1 wherein said first and second diode structure are connected in a common anode configuration.

13. The circuit of claim 1 including, a signal generator for generating an AC signal having positive and negative excursions, capacitive means for connecting said AC signal from the signal generator as the input signal to said amplifier, wherein one of said diode structures is reverse-biased during positive excursions and where the other of said diode structures is reverse-biased during negative excursions maintaining a high impedance between said capacitive means and said amplifier.

* * * * *